United States Patent
Shah et al.

(10) Patent No.: US 10,841,019 B1
(45) Date of Patent: Nov. 17, 2020

(54) CROSS-CORRELATION MEASUREMENTS FOR MODULATION QUALITY MEASUREMENTS

(71) Applicant: NATIONAL INSTRUMENTS CORPORATION, Austin, TX (US)

(72) Inventors: Syed Jaffar Shah, Austin, TX (US); Edward B. Loewenstein, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 16/568,527

(22) Filed: Sep. 12, 2019

(51) Int. Cl.
*H04B 17/15* (2015.01)
*G01R 31/317* (2006.01)

(52) U.S. Cl.
CPC ....... *H04B 17/15* (2015.01); *G01R 31/31708* (2013.01)

(58) Field of Classification Search
CPC ............ H04B 17/15; H04B 17/16–409; G01R 31/31708; G01R 31/31709–36
See application file for complete search history.

(56) References Cited

U.S. PATENT DOCUMENTS

| | | | |
|---|---|---|---|
| 8,271,223 B2 | 9/2012 | Rawlins et al. | |
| 9,917,755 B1* | 3/2018 | Rullmann | H04L 43/0852 |
| 2010/0202301 A1* | 8/2010 | Wen | H04L 25/0216 370/252 |
| 2010/0218044 A1* | 8/2010 | Roblett | H04L 43/50 714/32 |
| 2016/0112887 A1* | 4/2016 | Dark | H04B 17/309 455/67.11 |
| 2017/0170916 A1* | 6/2017 | Olgaard | H04B 17/29 |
| 2018/0180655 A1* | 6/2018 | Kuse | G01R 29/26 |

OTHER PUBLICATIONS

Rubiola et al., "The Cross-spectrum Experimental Method", Femto-St Sciences & Technologies, Oct. 23, 2018, 39 pages.

\* cited by examiner

*Primary Examiner* — Yuwen Pan
*Assistant Examiner* — Angelica M Perez
(74) *Attorney, Agent, or Firm* — Kowert Hood Munyon Rankin and Goetzel PC; Jeffrey C. Hood; Luke S. Langsjoen

(57) ABSTRACT

Techniques are disclosed related to determining a modulation quality measurement of a device-under-test (DUT). A modulated signal is received from a source a plurality of times, and each received modulated signal is transmitted to each of a first vector signal analyzer (VSA) and a second VSA. The first VSA and the second VSA demodulate the received modulated signals to produce first error vectors and second error vectors, respectively. A cross-correlation calculation is performed on the first error vectors and second error vectors of respective received modulated signals to produce a cross-correlation measurement, and the cross-correlation measurement is averaged over the plurality of received modulated signals. A modulation quality measurement is determined based on the averaged cross-correlation measurement.

20 Claims, 10 Drawing Sheets

CROSS-CORRELATION MEASUREMENTS FOR MODULATION QUALITY MEASUREMENTS

FIELD OF THE INVENTION

The present invention relates to the field of modulation quality measurements, and more specifically, to systems and methods for utilizing cross-correlation to improve the dynamic range of modulation quality measurements.

DESCRIPTION OF THE RELATED ART

Modern wireless communication standards (e.g., 4G LTE and other communication standards) employ a combination of amplitude modulation and phase modulation to encode information. Given a major focus in portable electronics to increase transmission fidelity, a device-under-test (DUT) may have its modulation quality measured during device design and/or testing. During a modulation quality measurement, it may be difficult to isolate noise and distortion originating from the DUT from other sources of noise and distortion, such as the transmission medium and the electronics included within the measurement system. As such, improvements in the field are desirable.

SUMMARY

Embodiments described herein relate to systems, memory media, and methods for determining a modulation quality measurement of a device-under-test (DUT) by utilizing a cross-correlation calculation on first error vectors and second error vectors associated with a first vector signal analyzer (VSA) and a second VSA, respectively. Note that the two or more VSAs may be implemented on the same instrument with multiple ports and more than 2 measurement channels may be used to improve the measurement speed, but the discussions below are presented as 2 VSAs for simplicity.

In some embodiments, a measurement system is configured to determine a modulation quality measurement of a modulated signal that is received from a source a plurality of times, wherein the repetitions of the signal are nominally identical and differ only in the noise impairing each repetition. Each received modulated signal may be transmitted to each of a first VSA and a second VSA simultaneously (or substantially simultaneously). For each symbol in a sequence, the first VSA and the second VSA demodulate the symbols of the received modulated signals to produce a first error vector and a second error vector, respectively. A cross-correlation calculation is performed on the first error vector and second error vector of respective received modulated signals to produce a complex cross-correlation measurement, and the cross-correlation measurement is averaged over the plurality of received modulated signals. For each symbol, a modulation quality measurement is determined based on the averaged cross-correlation measurement. The individual modulation quality measurements at each symbol are root-sum-squared to produce an overall modulation quality measurement for the entire sequence or any subset of the entire sequence. The modulation quality measurement may include a noise and/or distortion level of the DUT.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiments is considered in conjunction with the following drawings.

Figure 1:
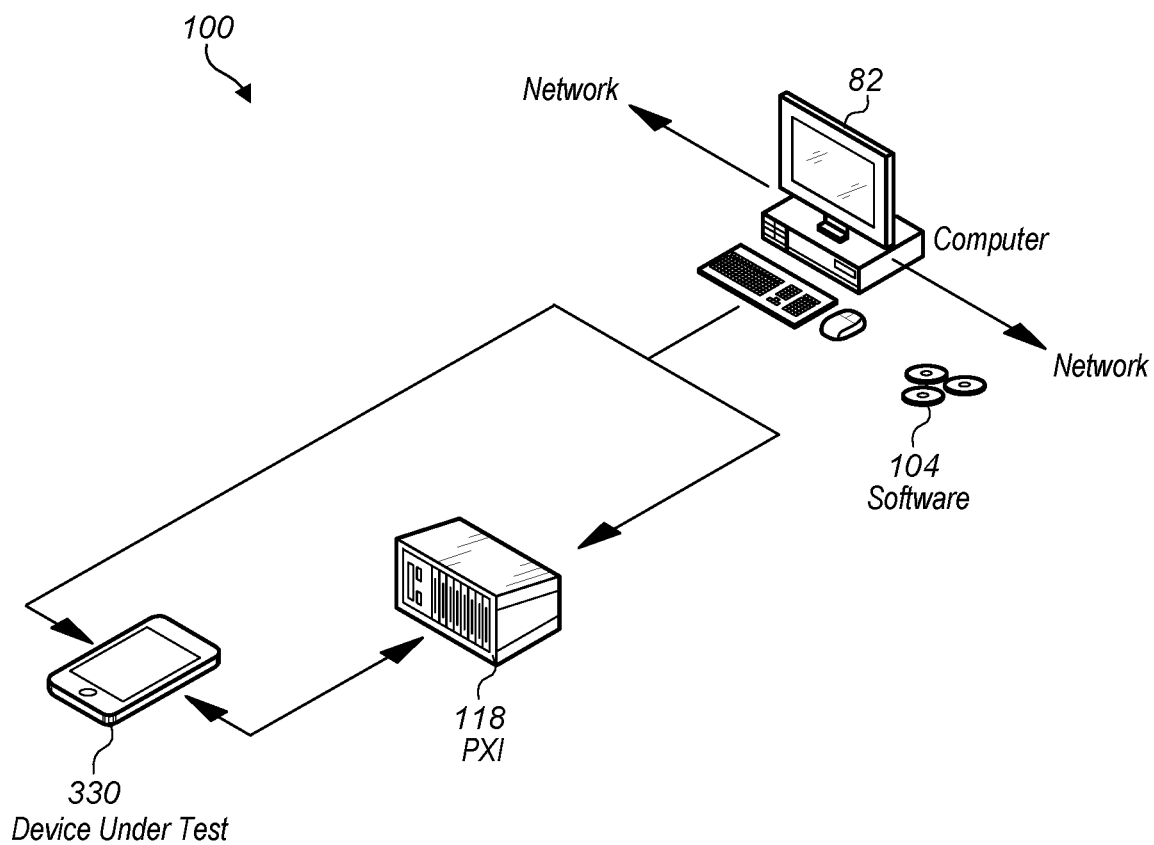
FIG. 1 illustrates an exemplary measuring system for measuring a device under test, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Terminology

The following is a glossary of terms used in the present document.

Memory Medium—A memory medium is a medium configured for the storage and retrieval of information. Examples of memory media include: various kinds of semiconductor memory such as RAM and ROM; various kinds of magnetic media such as magnetic disk, tape, strip and film; various kinds of optical media such as CD-ROM and DVD-ROM; various media based on the storage of electrical charge and/or other physical quantities; media fabricated using various lithographic techniques; etc. The term "memory medium" may also include a set of two or more memory media which reside at different locations, e.g., at different computers that are connected over a network.

Programmable Hardware Element—a hardware device that includes multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. As used herein, the term "program" includes within its scope of meaning: 1) a software program which is stored in a memory and is executable by a processor, or, 2) a hardware configuration program useable for configuring a programmable hardware element. Any of the method embodiments described herein, or, any combination of the method embodiments described herein, or, any subset of any of the method embodiments described herein, or, any combination of such subsets may be implemented in terms of one or more programs.

Software Program—the term "software program" is intended to have the full breadth of its ordinary meaning, and includes any type of program instructions, code, script and/or data, or combinations thereof, that may be stored in a memory medium and executed by a processor or computer system. Exemplary software programs include: programs written in text-based programming languages such as C, C++, Java™, Pascal, Fortran, Perl, etc.; graphical programs (programs written in graphical programming languages); assembly language programs; programs that have been compiled to machine language; scripts; and other types of executable software. A software program may comprise two or more subprograms that interoperate in a specified manner.

Hardware Configuration Program—a program, e.g., a netlist or bit file, that can be used to program or configure a programmable hardware element.

Computer System—any of various types of computing or processing systems, including a personal computer (PC), a mainframe computer system, a workstation, a laptop, a network appliance, an Internet appliance, a hand-held or mobile device, a personal digital assistant (PDA), a television system, a grid computing system, or other device or combinations of devices. In general, the term "computer system" can be broadly defined to encompass any device (or combination of devices) having at least one processor that is configured to execute instructions that are stored on a memory medium.

Measurement Device—includes instruments, data acquisition (DAQ) devices, smart sensors and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card, a video capture board, a smart camera, a motion control device, a robot having machine vision, and other similar types of devices. Exemplary "stand-alone" instruments include oscilloscopes, multimeters, signal analyzers, signal demodulators, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, e.g., may receive and analyze data, and issue automation control signals in response.

DETAILED DESCRIPTION

FIG. 1—Exemplary System for Measuring Modulation Quality

FIG. 1 illustrates an exemplary system that is configured to measure modulation quality, according to some embodiments presented herein. A computer 82 may be used by a user to conduct the modulation quality measurement process, and may be connected to a network and/or to the measurement apparatus. Software 104 may be installed on the computer to conduct the modulation quality measurement process. The computer 82 may be connected to any of a variety of signal generating apparatuses, according to various embodiments. For example, the computer may be connected to a Peripheral Component Interconnect (PCI) Extensions for Instrumentation (PXI) system 118 with configurable interface cards. Alternatively or additionally, the computer may be connected directly to a device under test (DUT) 330. The PXI system 118 and/or the computer 82 may serve as waveform generators to supply a signal to the DUT 330. The PXI system and/or computer may further function as a vector signal analyzer (VSA), to receive and analyze an output signal from the DUT. In other embodiments, the signal generator and/or signal analyzer may be comprised within the computer 82, which may be directly connected to the DUT 330.

Embodiments presented herein measure the electrical characteristics (e.g. radiofrequency (RF) performance, power added efficiency) of a device under test (DUT). In some embodiments, the DUT 330 may be stimulated with a control signal (e.g. from an arbitrary waveform generator (AWG), a vector or RF signal generator (VSG, RFSG), which may be comprised within a PXI system, a Versa Module Europa (VME) Extensions for Instrumentation (VXI) system, a computer, or some other signal generator, in various embodiments). The timing of the AWG and VSG output signals may be aligned such that the DUT exhibits optimal electrical characteristics. In some embodiments, the signal characteristics may be measured with a vector signal analyzer (VSA), which may be comprised within any of a PXI system, VXI system, or other computer system.

In some embodiments, separate devices may be used to perform some of the functions (e.g. the AWG, VSG, VSA, etc.) described above. These dedicated devices, which may be known in the art as "box" type instruments, may also be connected to a computer system. In some embodiments, the connected computer system may be configured to receive outputs from or provide inputs to the dedicated instruments. The connected computer system may also, in some embodiments, collect and store data or display outputs from the devices.

The illustrated embodiment shows an exemplary system that may be used to perform modulation quality measurements of a DUT. Calibration may be performed as a production test step during device manufacture or assembly. In some embodiments, system 100 may be also be used for device characterization or production test. In some embodiments, calibration may be performed to establish a suitable temporary condition for measurements. In other embodiments, measurements may be used for integration with the final product.

Figure 2:
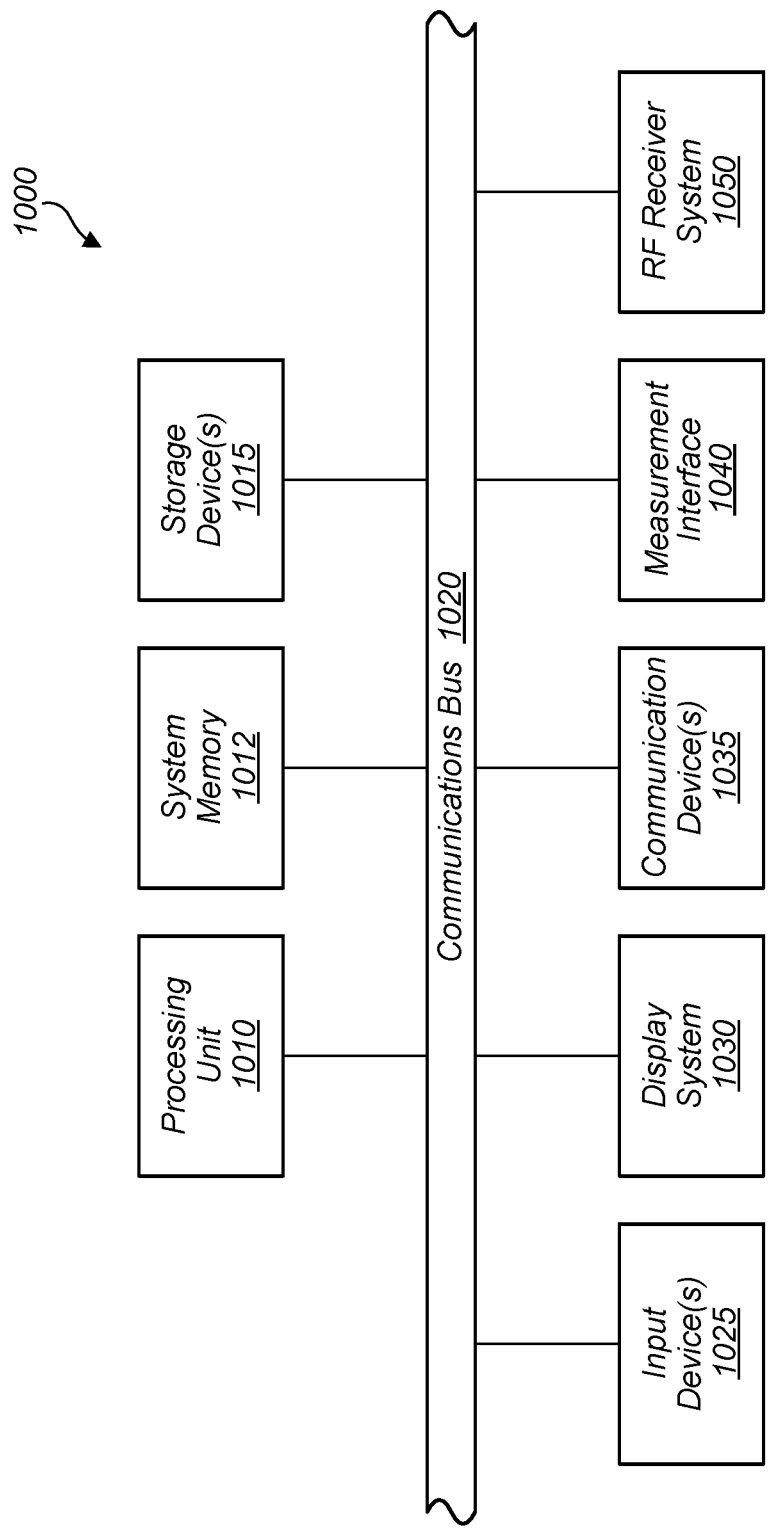
FIG. 2 illustrates an exemplary communication bus connecting a computer to the measuring system, according to some embodiments.

FIG. 2—Communication Bus

FIG. 2 illustrates an exemplary communication bus 1020 connecting a computer to the measuring system. The communications bus 1020 may be coupled to a processing unit 1010, a system memory 1012, and storage device(s) 1015. The communications bus 1020 may be further coupled to an input device(s) 1025 to receive input, a display system 1030, a communications device(s) 1035, a measurement interface 1040, and an RF receiver system 1050. The RF receiver system 1050 may be configured to receive inputs from one or more AWGs, VSGs, VSAs, or other components of the system. In some embodiments, the RF receiver system receives signals from each component of the measuring system. The display system 1030 that may facilitate user interface with the measuring system. The measurement interface 1040 may facilitate communication between the communications bus and the measuring apparatus. The RF receiver system 1050 may be configured to receive radio frequency signals from the measuring apparatus. In some embodiments, the RF receiver system 1050 may be comprised within an external AWG or VSG.

Modulation Quality Measurements

Modulation quality measurements are widely used during product development and testing, to determine the fidelity of a device-under-test (DUT) in transmitting a modulated signal. The modulated signal may utilize any of a variety of modulation techniques, such as quadrature amplitude modulation (QAM), phase-shift keying (PSK), frequency-shift keying (FSK), or amplitude-shift keying (ASK), among other possibilities. During a modulation quality measurement, the DUT transmits a modulated signal to a receiver, and the received signal is analyzed by a device such as a vector signal analyzer (VSA) to determine the degree of noise and distortion that is present in the received signal. The measuring instrument will be referred to herein as a VSA, although other types of devices may also be used to analyze the modulated signal, as desired.

Modulation quality measurements may be complicated by the fact that noise and distortion may be introduced into the modulated signal through a variety of sources. For example, the DUT, the transmission channel and/or transmission medium, and the receiver may all introduce noise and/or distortion. Typically, the noise and distortion that originates from the DUT itself is of particular interest, especially during DUT product testing and development. Embodiments herein utilize a cross-correlation calculation performed between two VSAs that receive a common modulated signal from a DUT to isolate the DUT noise and/or distortion over a wider dynamic range.

Modulation quality measurements may measure a variety of quantities, such as Error Vector Magnitude (EVM), Modulation Error Ratio (MER), or Rho, among other possibilities. For example, Rho is the ratio of the correlated power in a single coded channel to the total signal power. Equations and descriptions herein describe embodiments where the EVM is measured. However, it is considered within the scope of the disclosure to apply embodiments described herein more generally to any type of modulation quality measurement.

Modulation quality measurements made on a signal source are typically done using single-channel measuring instruments. In various embodiments, the signal source may be either a signal generator or an output of a device under test (DUT) excited by a modulated signal source, among other possibilities. The dynamic range of the measuring instrument may become a significant limitation for modulation quality measurements of high-performance signal sources. Embodiments herein describe a dual-measurement-channel cross-correlation-based system that overcomes these and other limitations and extends the dynamic range of modulation quality measurements by suppressing the noise contributions of the measurement system. While there are certain limitations imposed by cross-correlation-based measurement systems, the improvement in measurement dynamic range offers improvements for characterizing and testing signal chains and signal generators. In particular, embodiments herein may be useful when performance criteria are imposed that exceed the noise limitation imposed by the single channel measurement system.

Modulation quality measurements such as EVM may be influenced by many impairments, including signal source and measuring VSA distortion, linear impairments such as frequency response errors (amplitude and phase) and/or quadrature errors related to I/Q path imbalances, non-linear impairments such as intermodulation distortion (IMD), signal source and measuring VSA noise, broadband noise, phase noise, and timing errors among other possibilities. Further, the impairments may originate from either the DUT, the VSA, the transmission channel/medium, and/or other circuitry involved in the measurement process. Further, each source of impairment may be either correlated or uncorrelated across multiple repeated transmissions, and they may likewise be either correlated or uncorrelated across the two channels of a dual-channel VSA system, according to some embodiments. For example, phase noise may be entirely random and uncorrelated between the two VSAs, while linear distortion arising from the frequency response of the VSAs may be correlated for two VSAs with similar performance specifications.

Figure 3:
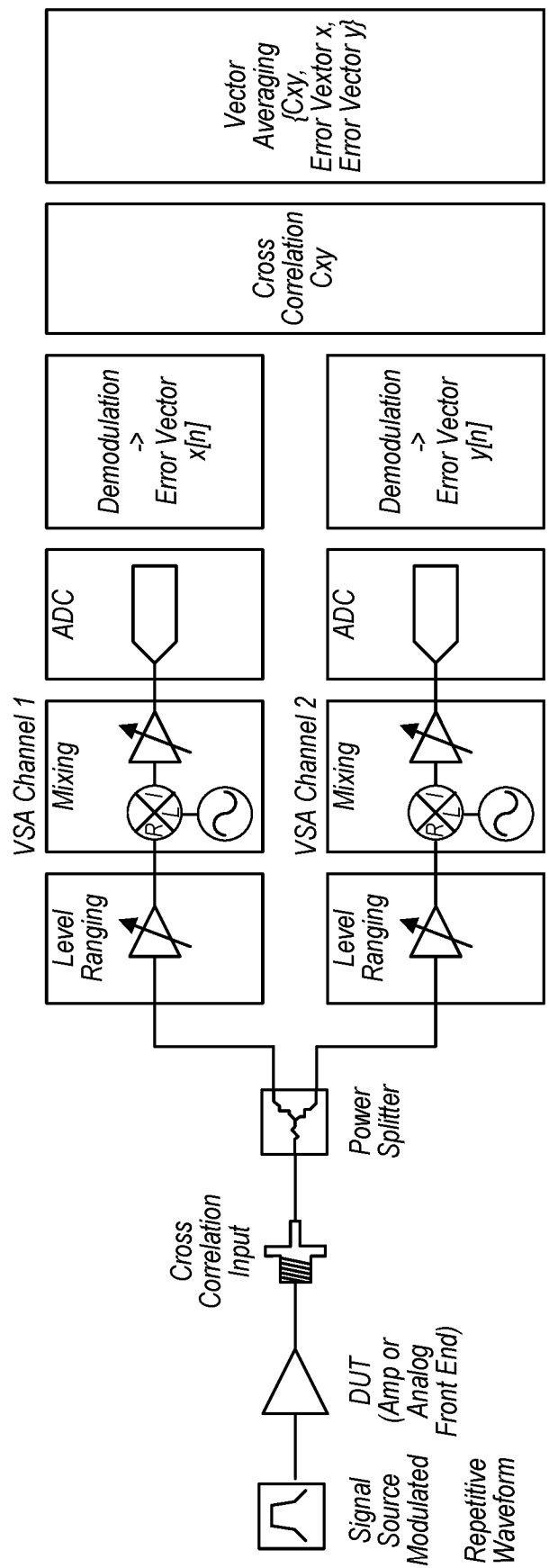
FIG. 3 is a schematic diagram illustrating a measurement system that utilizes dual vector signal analyzer (VSA) channels, according to some embodiments.

Various embodiments herein utilize either a dual-channel VSA or two synchronized VSAs to create a cross-correlation based measurement system. In some embodiments, the signal to be measured is split and then fed into two identical (or similar) measurement channels. FIG. 3 illustrates an exemplary simplified schematic diagram of a cross-correlation based measurement system, according to some embodiments. The modulated signal source may be the actual device under test (DUT) or the DUT may be an amplifier sourced by a modulated signal source or some other analog signal processing block generating a repetitive modulated signal. The signal from the DUT may be split into two (or more) copies by a power divider or power splitter. A passive power splitter may be used for this purpose due to its high linearity. An active splitter may be used as well with the understanding that any non-linearity introduced before the two measurement receivers in the signal path may be indistinguishable from the DUT non-linearity. The two measurement receivers, VSA Channel 1 and VSA Channel 2, may simultaneously sample the two waveforms that may be down-converted from a high frequency RF signal to a lower frequency via a mixing stage, in some embodiments. The lower frequency signal may be digitized by an analog to digital converter (ADC) and the digitized waveform may be demodulated by hardware or software processing to produce Error Vector streams x[n] and y[n]. as shown in FIG. 3. These error vector streams may be cross correlated and/or vector averaged, as described in more detail below, to get a higher dynamic range measurement of the modulation quality degradation originating from the DUT alone.

In some embodiments, VSA Channel 1 and VSA Channel 2 may be configured with attenuation to lower the signal levels in the active circuitry, which may generally translate into an increased noise profile but a lower distortion configuration. Alternatively, the input signal level may be boosted to decrease the noise profile at the cost of increased distortion.

Figure 4:
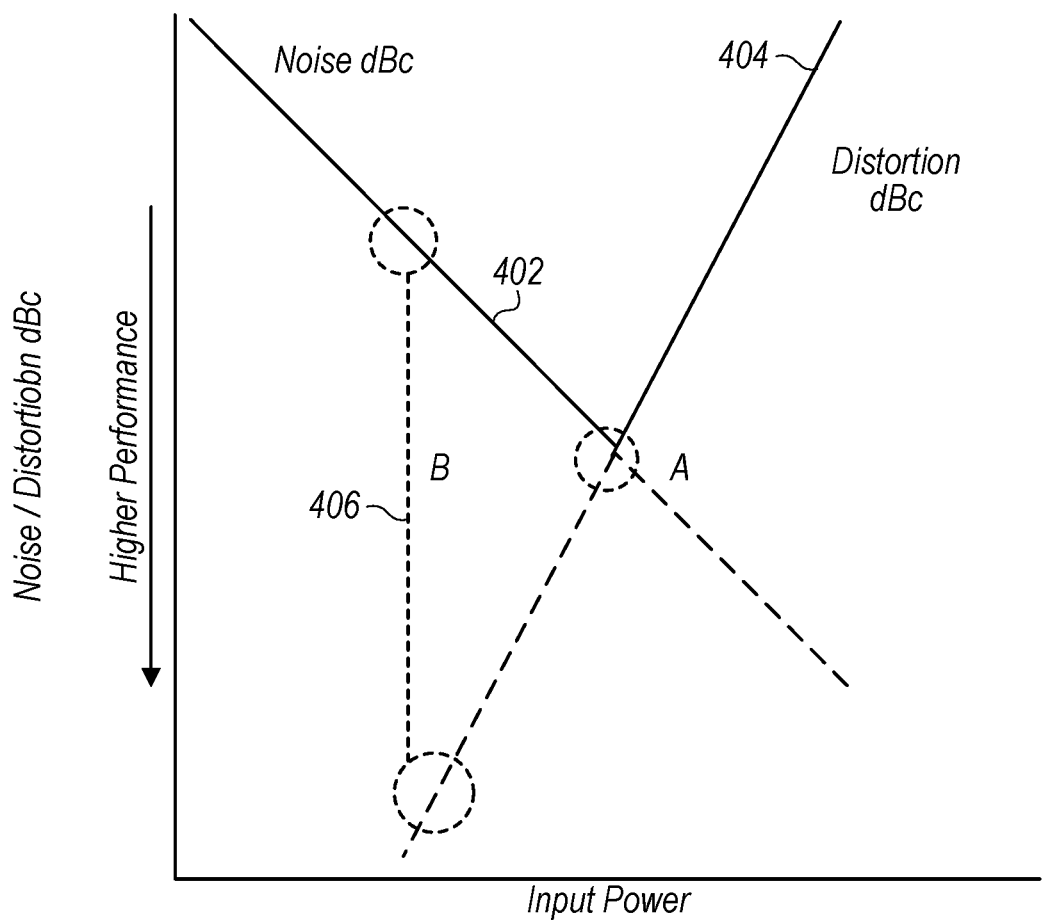
FIG. 4 is a plot of dynamic range, including the constituent components of noise and distortion, as a function of input power, according to some embodiments.

FIG. 4 is a graph illustrating the tradeoff of contributions of noise and distortion to modulation quality as a function of input power, according to some embodiments. As illustrated, configuration B (which is a relatively low input power configuration) experiences a very low distortion profile, but this is realized at the cost of a high noise contribution. Conversely, configuration A balances the contribution of noise and distortion to overall modulation quality, to obtain an improved signal-to-noise ratio (SNR) for a single channel system, as one example.

In some embodiments, for cross-correlation based measurements, the signal levels at the VSA inputs may be set to be lower than would be desirable for a single-channel system, since lowering the level may reduce the nonlinear distortion which might otherwise be introduced by the VSA receiver channels. This may introduce higher relative noise levels, but the noise signals introduced in the two VSA measurement channels are uncorrelated with each other and may be reduced by averaging a plurality of cross-correlation measurements of the individual symbol vector errors in the two channels. Effectively suppressing the uncorrelated noise from each VSA channel to a desired level may involve averaging over the results from a larger number of repeated measurements. In other words, in some embodiments, the number of repeated measurements averaged over may be increased to increase the level of noise suppression until a desired threshold level of residual noise is obtained.

Increasing the number of measurements may increase the overall measurement time. In some embodiments, the number of measurements may be selected to balance between a desired level of noise suppression and an acceptable duration of overall measurement time, depending on the specific requirements of the measurement process. More than two measurement channels may also be used improve the measurement speed for a given performance level.

Contributions to the Error Vectors

For each modulation symbol, the error vector originating from the VSA, $E_{VSA}$, may be decomposed into two separate contributions, as shown in the equation (1) below. Note that these contributions are complex quantities which may have real and imaginary components, in general.

$$E_{VSA} = E_{NA} + E_{DA} \quad (1)$$

Here $E_{NA}$ represents all noise added by the VSA, where "noise" refers to contributions that are uncorrelated with the signal and will average to zero over subsequent acquisitions. This may include, for example, phase noise and broadband noise. $E_{DA}$ represents deterministic errors, which depend on the modulated signal and which are repeated in each acquisition. This may include inter-symbol interference (linear distortion from frequency response or quadrature errors) added by the VSA and intermodulation distortion (nonlinear distortion) added by the VSA.

Similarly, the vector signal generator (VSG) has an error vector represented as $E_{VSG}$, which may be decomposed into separate contributions as follows:

$$E_{VSG} = E_{NG} + E_{DG} \quad (2)$$

Here $E_{NG}$ is noise added by the VSG, and $E_{DG}$ is the deterministic error added by the VSG.

As used herein, $E_{VSG}$ may refer to either the error vector of the VSG in isolation, or the combined error contributions from the VSG and the DUT, in various embodiments. For example, the expression for $E_{VSG}$ may be used to represent the error vector from either the signal generator in isolation or the signal generator followed by a DUT amplifier. In any case, $E_{VSG}$ represents the error in the signal that is presented to each of the VSAs.

The total combined error vector may be expressed as $E = E_{VSA} + E_{VSG}$. When two VSAs (e.g., VSA1 and VSA2) are measuring the same signal produced by a single VSG, the two combined error vector measurements may be represented as $E_1$ (or E_1) and $E_2$ (or E_2). Similarly, subscripts "1" or "2" on individual contributions to the error vectors may be understood to refer to the error vector contributions corresponding to either VSA1 or VSA2, respectively (e.g., $E_{NA1}$ may refer to the noise contributed by VSA1). The error vectors of the two measurements from the two VSAs may have both correlated components from the VSG and the respective VSA, as well as uncorrelated components. For example, $E_{NG}$, $E_{DG}$, and $E_{DA}$ may be correlated in the two VSA channels. For example, all VSG error vector components may be correlated between the two channels, since they originate from a single VSG and/or DUT. The deterministic errors, $E_{DA1}$ and $E_{DA2}$, in the VSA error vectors may likewise be correlated, as they may be systematic errors that arise from the performance specifications of the two similar VSAs. However, $E_{NA1}$ and $E_{NA2}$ may not correlated with each other, as they arise from random noise introduced to the two VSAs.

In some embodiments, the contributions of $E_{NA1}$ and $E_{NA2}$ (which are uncorrelated between the two VSAs) to the overall error vector may be reduced by utilizing an averaging procedure over a cross-correlation calculation. Specifically, the average of the cross-correlation of the two complex error vector waveforms, "CC", may be computed as:

$$CC^2 = \left| \frac{1}{n} \sum_{k=1}^{n} E_1[k] E_2^*[k] \right| \quad (3)$$

$$= \left| \frac{1}{n} \sum_{k=1}^{n} (E_{VSA1}[k] + E_{VSG}[k]) * (E_{VSA2}^*[k] + E_{VSG}^*[k]) \right|$$

$$= \left| \frac{1}{n} \sum_{k=1}^{n} (E_{VSA1}[k] E_{VSA2}^*[k] + E_{VSA1}[k] E_{VSG}^*[k] + E_{VSG}[k] E_{VSA2}^*[k] + E_{VSG}[k] E_{VSG}^*[k]) \right|$$

In equation (3), E_1 is the total error vector measured by VSA1, E_2* is the complex conjugate of E_2, which is the total error vector measured by VSA2, n is the number of acquisitions to be averaged, and the index k is the individual acquisition number. In other words, the summation over the index k and dividing by n describes an averaging process over n sequential generations of a signal by the VSG and/or DUT and measurements by the two VSAs. The middle two terms in the final expression of equation (3), $$\frac{1}{n}\sum_{k=1}^{n} E_{VSA1}[k]E_{VSG}^*[k] \text{ and } \frac{1}{n}\sum_{k=1}^{n} E_{VSG}[k]E_{VSA2}^*[k],$$

converge to zero as n increases to infinity when the errors of the VSG are uncorrelated with the errors of the two VSAs. More generally, the middle two terms may be reduced to any desired level by increasing the number of repetitions of the modulated signal, n, that are averaged over. The first term, $$\frac{1}{n}\sum_{k=1}^{n} E_{VSA1}[k]E_{VSA2}^*[k],$$

may contain contributions that are either correlated or uncorrelated between the two VSAs, as described above. Accordingly, the uncorrelated contributions (i.e., $E_{NA1}$ and $E_{NA2}$) also converge to zero if the random errors in the two VSAs are uncorrelated. For sufficiently large n, this leaves significant error contributions only from the correlated (deterministic) part of the first term, $$\frac{1}{n}\sum_{k=1}^{n} E_{DA1}[k]E_{DA2}^*[k],$$

and from the last term, $$\frac{1}{n}\sum_{k=1}^{n} E_{VSG}[k]E_{VSG}^*[k]),$$

which simplifies to $$\frac{1}{n}\sum_{k=1}^{n} |E_{VSG}[k]|^2$$

and is the error power of the VSG, to contribute to the measured error power.

Accordingly, the averaging procedure described in equation (3) may result in suppressing the random noise components, $E_{NA1}$ and $E_{NA2}$, leaving only the correlated noise component from the VSG ($E_{NG}$), the correlated deterministic component from the VSG ($E_{DG}$), and the components that are correlated between the VSAs ($E_{DA1}$ and $E_{DA2}$).

Advantageously, the amount of suppression of random noise components increases with the number of averages. In general, the noise power reduction approximately scales as the square root of the number of averages.

The cross-correlation technique is different from vector-averaging repetitively-synchronized waveforms, which suppresses all random errors in the signal paths, leaving only the deterministic error components, i.e. non-linear and linear distortion. As explained in further detail below, vector-averaging may be used in conjunction with cross-correlation, in some embodiments, to indirectly measure the VSG random noise, which appears in the cross-correlation error measurement but not in the vector-averaged error measurement.

The following paragraphs present equations to describe the various quantities derived according to embodiments described herein. In the following equations, "i" is one of m symbols in a repeated sequence, "k" is one of n acquisitions of the repeated sequence, an individual vector error in channel 1 at symbol i in acquisition k is complex quantity $E_{ik1}$, an individual vector error in channel 2 at symbol i in acquisition k is complex quantity $E_{ik2}$, the cross-correlated EVM result is CC, the two-channel vector-averaged EVM is VA, the EVM due to transmitter noise is TXN, and the EVM due to uncorrelated receiver noise is RXN.

The EVMs may be derived for a single acquisition k, averaged over all symbols in the acquisition as follows:

$$EVM_1(k) = \sqrt{\frac{1}{m}\sum_i |E_{ik1}|^2} \qquad (4)$$

$$EVM_2(k) = \sqrt{\frac{1}{m}\sum_i |E_{ik2}|^2} \qquad (5)$$

The EVMs averaged over all symbols and all acquisitions may be expressed as:

$$EVM_1 = \sqrt{\frac{1}{mn}\sum_i \sum_k |E_{ik1}|^2} \qquad (6)$$

$$EVM_2 = \sqrt{\frac{1}{mn}\sum_i \sum_k |E_{ik2}|^2} \qquad (7)$$

Finally, the relevant vector-averaged quantities may be expressed as:

$$CC = \sqrt{\frac{1}{mn}\sum_i \left|\sum_k E_{ik1} E_{ik2}^*\right|} \qquad (8)$$

$$VA = \sqrt{\frac{1}{mn}\sum_i \left|\left(\frac{1}{n}\sum_k E_{ik1}\right)\left(\frac{1}{n}\sum_k E_{ik2}\right)^*\right|} \qquad (9)$$

$$TXN = \sqrt{CC^2 - VA^2} \qquad (10)$$

$$RXN = \sqrt{\frac{1}{m}\sum_i \sqrt{\left(\frac{1}{n}\sum_k |E_{ik1}|^2\right)\left(\frac{1}{n}\sum_k |E_{ik2}|^2\right)} - CC^2} \qquad (11)$$

It is noted that the index i is summed over the m symbols of the sequence encoded in the modulated waveform, in some embodiments. In other embodiments, the index i may cover specific subsets of the sequence, such as different subcarriers of the modulated waveform, so that the analysis may be performed on a subcarrier-by-subcarrier basis. Alternatively, in some embodiments, the index i may be summed over both symbol position and subcarrier. For example, each symbol may have bits encoded in a plurality of subcarriers, such that the summation may be performed over each subcarrier, for each symbol position. More generally the index i may be interpreted to refer to a summation over any index that references the locations of symbols encoded into the modulated waveform, in various embodiments. In some embodiments, the index i may be summed over just a single symbol out of the entire sequence of symbols.

Note that Equation (8) CC for the cross correlated EVM is similar to equation (3) for CC, except that Equation (8) explicitly includes an average over the symbols in the modulation signal. As shown above, the cross-correlation EVM (Eq. 8) and the vector-averaged EVM (Eq. 9) may be utilized to determine the transmission noise, TXN (Eq. 10). The vector-averaged EVM performs the summation over the n acquisitions prior to cross-correlating the EVM contributions from VSA1 and VSA2. This effectively removes all (or substantially all) noise contributions to the overall EVM from VA, while not removing deterministic contributions to the overall EVM that appear in every repetition of the sequence. Accordingly, taking the square root of the difference of the squares of CC and VA may result in an expression that isolates the EVM noise contributions from the transmitter (i.e., the VSG and/or the DUT).

FIG. 5—Experimental Results

Figure 5A:
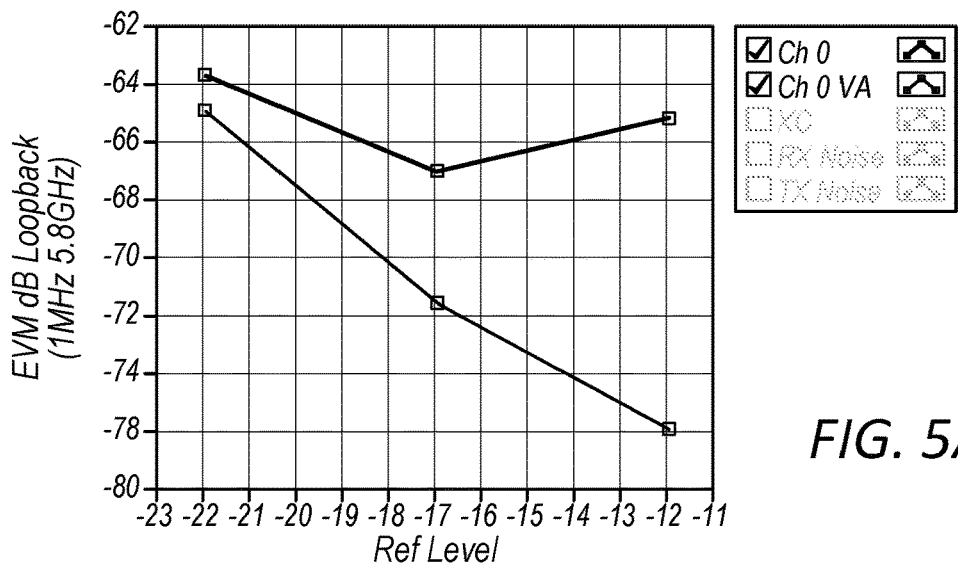
FIGS. 5A-C are plots of error vector magnitude (EVM) as a function of receiver reference level under different scenarios, according to some embodiments.
Figure 5B:
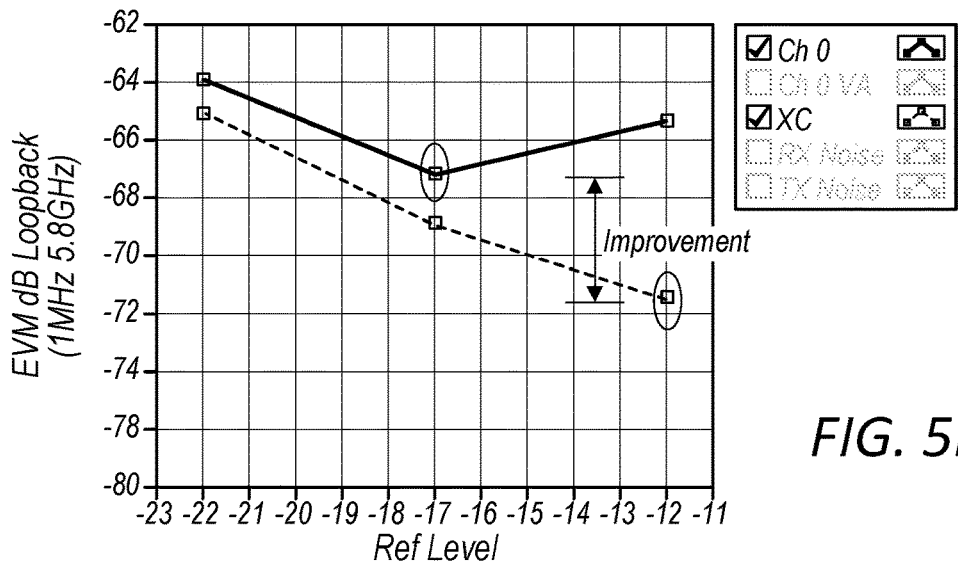
Figure 5C:
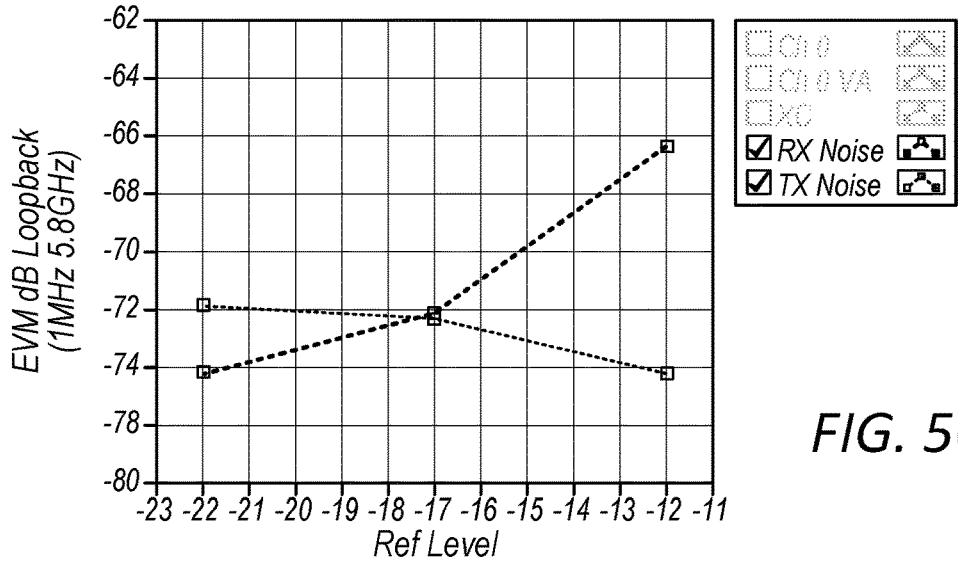

FIGS. 5A-C are plots illustrating experimental results for reducing uncorrelated error in a dual VSA system, according to some embodiments. To obtain the results illustrated in FIG. 5, a QAM signal was generated with a VSG and measured with two independent VSAs. Note that the x-axis in FIGS. 5A-C is the Reference Level of the VSA, which represents the attenuation of the signal that is input to the VSAs. which is effectively the reverse of the input power, which is the x-axis in FIG. 4. In other words, the right side of FIGS. 5A-C corresponds to higher input power, while the left side corresponds to lower input power.

As shown in FIG. 5A, "Raw and Vector Average", the raw and vector averaged results are shown as a function of VSA Reference Level. The stimulus power (input power) is kept constant in all the plots. As the VSA reference level increases, increased attenuation of the signal in the VSA signal chain leads to improvement at first and then degradation, as expected, as the VSA signal chain goes from a distortion-limited configuration on the left to a balanced noise/distortion configuration, and then to a noise-limited configuration on the right.

The best EVM measured in FIG. 3A is ~−67 dB with a single VSA. Vector averaging with a single VSA improves the measured EVM to ~−76 dB but that suppresses both the VSG and VSA noise and so is not a valid measurement of the VSG EVM. However, the Vector Averaged EVM measurement may be useful for subsequently separating the VSG and VSA noise contributions to the EVM.

FIG. 5B is a plot illustrating how the cross-correlated (XC) EVM improves the measurement of the VSG EVM from ~−67 dB in a single channel to −71 dB in the cross-correlation system. Further, the cross-correlated EVM does not remove the VSG noise, such that the VSG noise may be more accurately characterized, according to some embodiments.

In FIG. 5C, "Rx and Tx Noise Extracted", the cross-correlated EVM and the Vector Averaged EVM are utilized to extract the noise contributions to the EVM of the VSG and the VSA channel.

Figure 6:
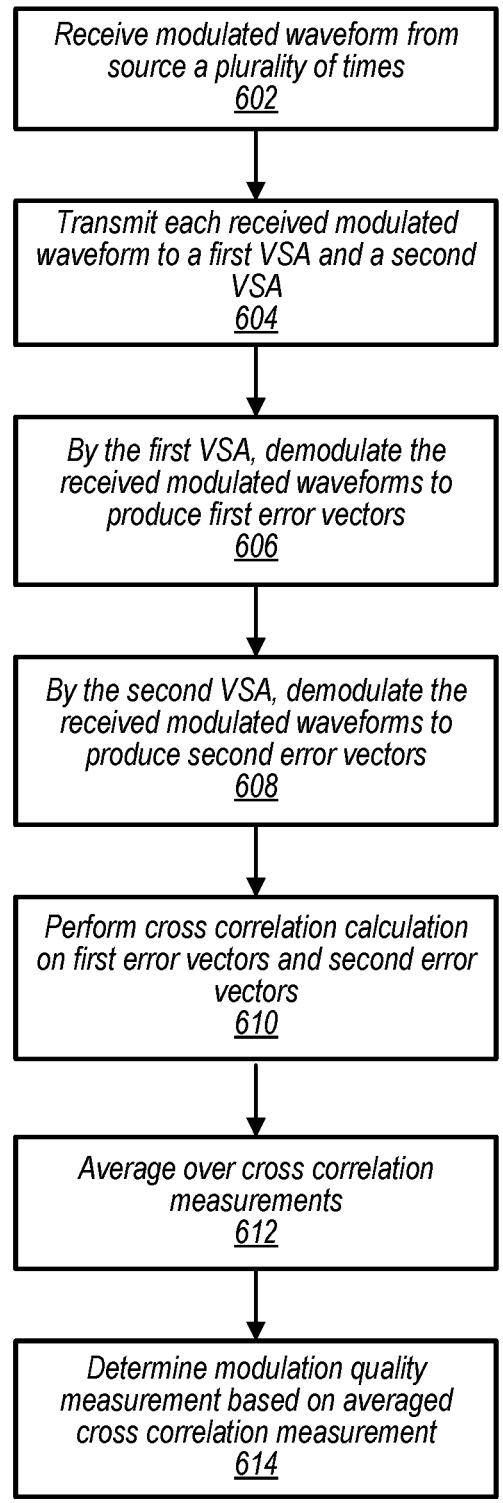
FIG. 6 is a flow chart diagram illustrating an exemplary method for utilizing a cross-correlation calculation between two VSAs to reduce measurement error, according to some embodiments.

FIG. 6—Flowchart Diagram

FIG. 6 is a flowchart diagram illustrating a method for utilizing cross-correlation between two vector signal analyzers (VSAs) for calculating a modulation quality measurement, according to some embodiments. In some embodiments, the described methods may be directed by a computing device comprising a processor operably coupled to a non-transitory memory medium. In other embodiments, the described methods may be directed by a computing device using one or more custom-designed hardware devices such as ASICs and/or using one or more programmable hardware elements such as FPGAs. In various embodiments, some of the elements of the methods shown may be performed concurrently, in a different order than shown, may be substituted for by other method elements, or may be omitted. Additional method elements may also be performed as desired. As shown, the method may operate as follows.

At 602, a modulated waveform is received from a source a plurality of times. In some embodiments, the source may be a vector signal generator (VSG), a VSG coupled to a device-under-test (DUT), or a standalone DUT. The modulated waveform may be a quadrature amplitude modulation (QAM) waveform, or it may be modulated using phase-shift keying (PSK), frequency-shift keying (FSK), or amplitude-shift keying (ASK), among other possibilities. The modulated waveform may be a sequence comprising a plurality of symbols, and/or it may comprise a plurality of subcarriers. Each of the plurality of received modulated waveforms may be the same sequence, but each received waveform may have experienced different noise and/or distortion during transmission. In other words, the source may transmit the same modulated waveform a plurality of times, but each received modulated waveform may have experienced a unique noise and/or distortion profile.

At 604, the plurality of received modulated waveforms is transmitted to each of a first vector signal analyzer (VSA) and a second VSA. In some embodiments, each the plurality of modulated waveforms may be received by a splitter, and the splitter may transmit each of the received modulated waveforms to each of the first VSA and the second VSA. The modulated waveforms may accumulate impairments comprising noise and/or distortion through one or more of the sources, the transmission channel and/or transmission medium, and the first VSA or the second VSA. In other words, upon reception by the first VSA and the second VSA, the modulated waveforms may have accumulated impairments to the initial modulated waveform. Different contributions to the impairments may be either correlated or uncorrelated between the first VSA and the second VSA, and further may be either correlated or uncorrelated across successive modulated waveforms that are received from the source. In other words, while the first VSA and the second VSA each receive the modulated waveform, the modulated waveform received by each VSA may have experienced a unique noise and/or distortion profile.

In some embodiments, a gain may be selected and applied to the received modulated waveform. In various embodiments, the gain may be applied prior to transmission to the first VSA and the second VSA, or may be separately applied within each of the first VSA and the second VSA after reception of the modulated waveform. In these embodiments, the number of times the modulated waveform is received from the source may be based at least in part on the selected gain. For example, a smaller gain may introduce lower distortion and a larger noise profile to the modulated waveforms. As described in greater detail below, a cross-correlation calculation is utilized to remove noise that is uncorrelated between the first VSA and the second VSA, and the degree of noise suppression of the uncorrelated noise may increase as the number of modulated waveforms that are averaged over is increased. Accordingly, a smaller gain may be utilized in conjunction with a larger number of received modulated waveforms, to increase the number of cross-correlation measurements contributing to the average. Conversely, a larger gain may result in a smaller noise profile, and a desirable degree of uncorrelated noise reduction may be obtained with a relatively smaller number of received modulated waveforms.

In some embodiments, a target level of noise reduction associated with the modulation quality measurement may be determined, and the selected gain to be applied to the received modulated waveform may be selected based at least in part on the determined target level of noise reduction. For example, a smaller gain may result in a larger noise profile, the uncorrelated components of which may be reduced to a target level of noise reduction.

Increasing the number of modulated waveforms received from the source may increase the measurement time of the described method, in some embodiments. Accordingly, the selected gain, the number of received modulated waveforms, and a target level of noise reduction may be jointly considered in selecting the parameters of the measurement process, in some embodiments.

At 606, for each of the plurality of received modulated waveforms, the first VSA demodulates the received modulated waveform to obtain a plurality of respective first error vectors. The first error vectors may be obtained by taking a difference between each waveform demodulated by the first VSA and a reference waveform. The first error vectors may quantify the impairments experienced by the modulated waveforms from noise and/or distortion of the source, transmission channel/medium, and the first VSA.

At 608, for each of the plurality of received modulated waveforms, the second VSA demodulates the received modulated waveform to obtain a plurality of respective second error vectors. The second error vectors may be obtained by taking a difference between each waveform demodulated by the second VSA and a reference waveform. The second error vectors may quantify the impairments experienced by the modulated waveforms from noise and/or distortion of the source, transmission channel/medium, and the second VSA.

At 610, for each of the plurality of received modulated waveforms, a cross-correlation calculation is performed on the respective first error vector and the respective second error vector to obtain a cross-correlation measurement. For example, for each of the received modulated waveforms, the respective first and second error vectors derived from the received modulated waveform may be cross correlated as described above in Eqs. 3 and/or 8, and this may be repeated for each of the plurality of received modulated waveforms.

At 612, averaging over the cross-correlation measurements corresponding to each of the plurality of received modulated waveforms is performed to obtain an averaged cross-correlation measurement. In some embodiments, performing the cross-correlation calculation on the respective first error vectors and the respective second error and performing said averaging reduces noise that is uncorrelated between the first VSA and the second VSA in the modulation quality measurement. Examples of uncorrelated noise may include phase noise and broadband noise, among other possibilities. Advantageously, the cross-correlation and averaging may reduce noise that is uncorrelated between the first and second VSA and may also reduce noise that is uncorrelated across the plurality of received modulated waveforms. Accordingly, the averaged cross-correlation measurement may contain information related to correlated noise and/or distortion, which may originate predominantly from the source. The averaged cross-correlation measurement may further include information related to systematic impairments present in both the first VSA and the second VSA, which may therefore be correlated between the first VSA and the second VSA as well as across the plurality of received modulated waveforms.

In some embodiments, said performing the cross-correlation calculation and said averaging over the cross-correlation measurements is performed separately for each of a plurality of symbols of the received modulated waveforms, and/or is performed separately for each of a plurality of subcarriers of the received modulated waveforms. For example, the cross-correlation calculation and the averaging may be performed on a per-symbol basis and/or a per-subcarrier basis, wherein an averaged cross-correlation measurement is obtained for each of a plurality of symbols of the sequence and/or for each of a plurality of subcarriers of the waveform.

At 614, a modulation quality measurement is determined based at least in part on the averaged cross-correlation measurement. In various embodiments, the modulation quality measurement may be an error vector magnitude (EVM), a modulation error ratio (MER), Rho, or another type of modulation quality measurement. The modulation quality measurement may characterize one or more contributions to noise and/or distortion associated with the received modulated waveforms. For example, in exemplary embodiments, the source may be a DUT, and the modulation quality measurement may comprise a quantity of transmitter noise and distortion originating from the DUT. The modulation quality measurement may be determined based on a comparison of the averaged cross-correlation measurement and a second vector averaged measurement determined based on the first errors vectors and the second error vectors, such as the quantity expressed in Eq. 9. Because the uncorrelated noise has been removed and/or reduced in the averaged cross-correlation measurement, the modulation quality measurement may more accurately reflect noise and/or distortion introduced by the source in transmitting the modulated waveform.

For example, in some embodiments, the first quality measurement may include a level of transmission noise of the source. In these embodiments, vector averaging may be performed over the first error vectors of the plurality of received modulated waveforms to obtain a first vector averaged error vector, and over the second error vectors of the plurality of received modulated waveforms to obtain a second vector averaged error vector. In these embodiments, a vector averaged measurement may be obtained based at least in part on the first vector averaged error vector and the second vector averaged error vector. For example, in some embodiments the first vector averaged error vector may be multiplied by the second vector averaged error vector (or alternatively, by a complex conjugate of the second vector averaged error vector) to obtain a vector averaged measurement as described in Eq. 9, and the vector averaged measurement may describe the received modulated waveform with both the correlated and the uncorrelated noise removed or reduced. In these embodiments, subtracting the square of the vector averaged measurement from the square of the cross-correlation measurement may provide an estimate of the correlated noise of the source. In other words, determining the modulation quality measurement based at least in part on the averaged cross-correlation measurement may include subtracting the square of the vector averaged measurement from the square of the cross-correlation measurement. Said another way, the vector averaged measurement and the cross-correlation measurement may be compared to determine the level of transmission noise of the source.

Figure 7A:
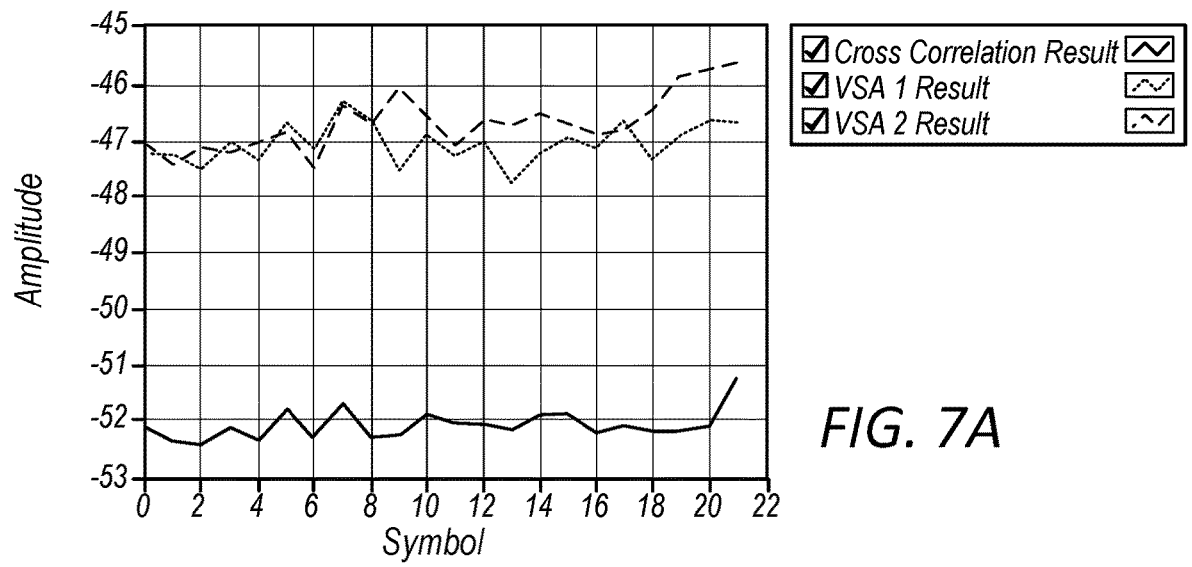
FIGS. 7A-B are plots of EVM amplitude as a function of symbol position and subcarrier, respectively, according to some embodiments.
Figure 7B:
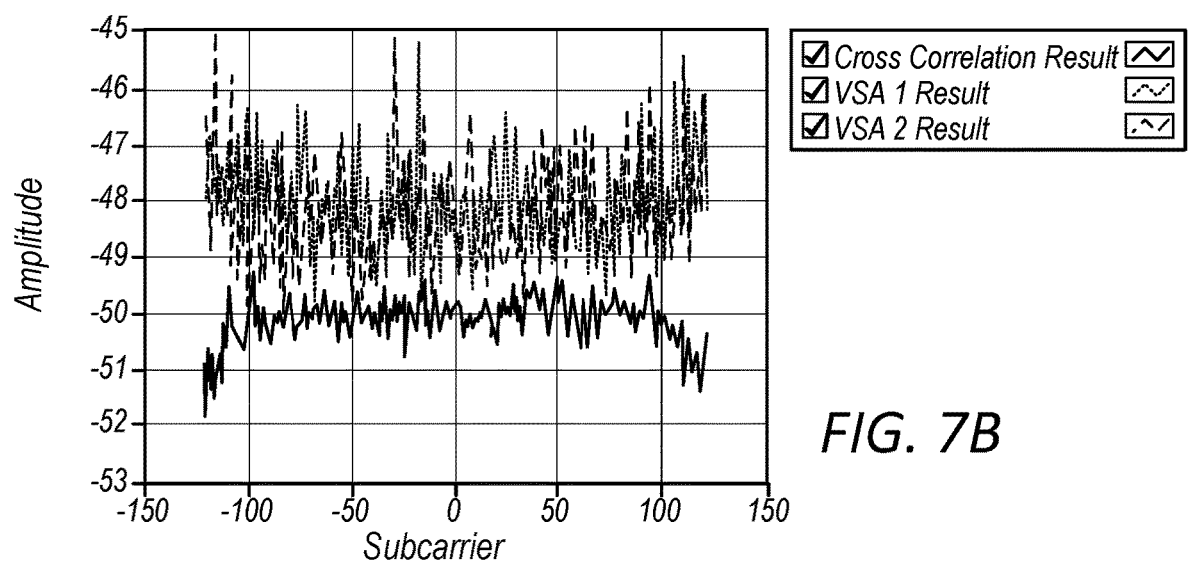

FIGS. 7A-7B—Plots of EVM Amplitude Vs. Symbol Position and Subcarrier

FIGS. 7A-B are plots of EVM amplitude as a function of symbol position and subcarrier, respectively, according to some embodiments. Specifically, FIG. 7A is a plot of EVM amplitude for VSA1, VSA2, and the cross-correlation measurement of VSA1 and VSA2 as a function of symbol position. For example, a modulated waveform may encode a message that comprises a sequence of symbols, and FIG. 7A illustrates the EVM result from considering each symbol position individually. FIG. 7A illustrates how the reduction in uncorrelated noise that results from the cross-correlation result is present on an individual symbol basis, and may be obtained for each symbol individually without necessarily averaging over all symbols in the sequence.

Similarly, FIG. 7B is a plot of EVM amplitude for VSA1, VSA2, and the cross-correlation measurement of VSA1 and VSA2 as a function of subcarrier. For example, a modulated waveform may include bits encoded within a plurality of subcarriers, and FIG. 7B illustrates how the reduction in uncorrelated noise that results from the cross-correlation result is present on per-subcarrier basis.

For reference, it is noted that the results shown in FIGS. 7A-7B may be derived from the following equations for the EVM amplitude:

$$EVM_{1,i} = \sqrt{\frac{1}{n}\sum_k |E_{ik1}|^2} \quad (12)$$

$$EVM_{2,i} = \sqrt{\frac{1}{n}\sum_k |E_{ik2}|^2} \quad (13)$$

$$CC_i = \sqrt{\frac{1}{n}\left|\sum_k E_{ik1} E_{ik2}^*\right|} \quad (14)$$

It is noted that Eqs. 12-14 are similar to Eqs. 4, 5, and 8, except that Eqs. 12-14 do not include the summation over the index i, wherein the index i represents either the symbol position (for FIG. 7A) or the subcarrier (FIG. 7B).

Figure 8:
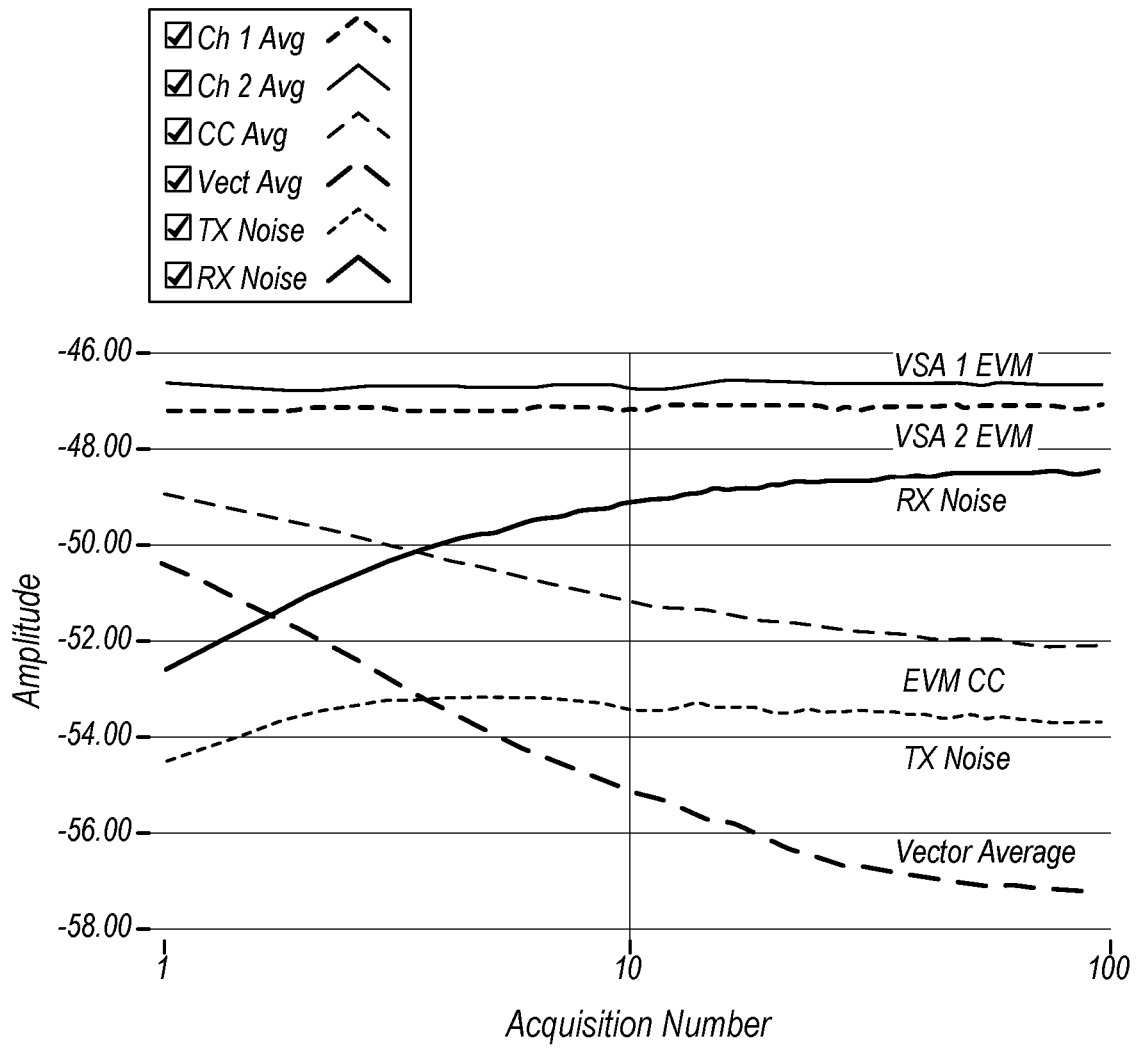
FIG. 8 is a plot of different contributions to EVM amplitude as a function of the number of acquisitions, according to some embodiments.

FIG. 8—EVM Contributions as a Function of Acquisition Number

FIG. 8 is a semi-log plot of different contributions to EVM amplitude as a function of the number of acquisitions used, according to some embodiments. Specifically, FIG. 8 illustrates the EVM amplitudes of Eqs. 6-11 as a function of the number of acquisitions (i.e., the number of received modulated waveforms).

As illustrated, the single-channel EVM amplitudes of VSA1 and VSA2 are roughly constant with increasing acquisition number. However, the cross-correlation measurement (CC) and the vector average measurement (VA) both decrease as acquisition number increases.

Figure 9A:
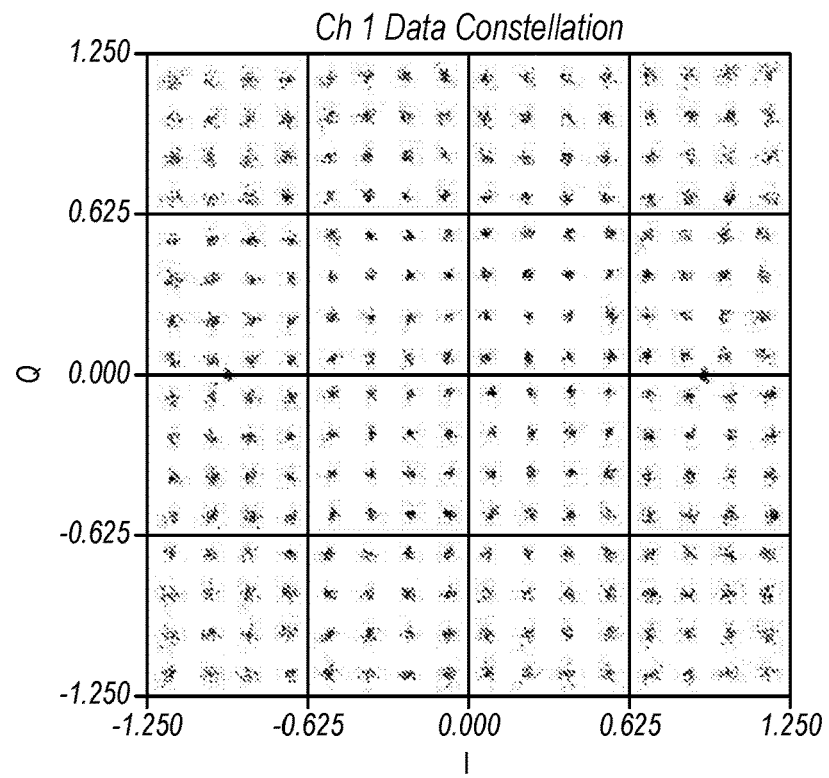
FIGS. 9A-B are constellation diagrams of a raw data constellation and a vector averaged constellation, according to some embodiments.
Figure 9B:
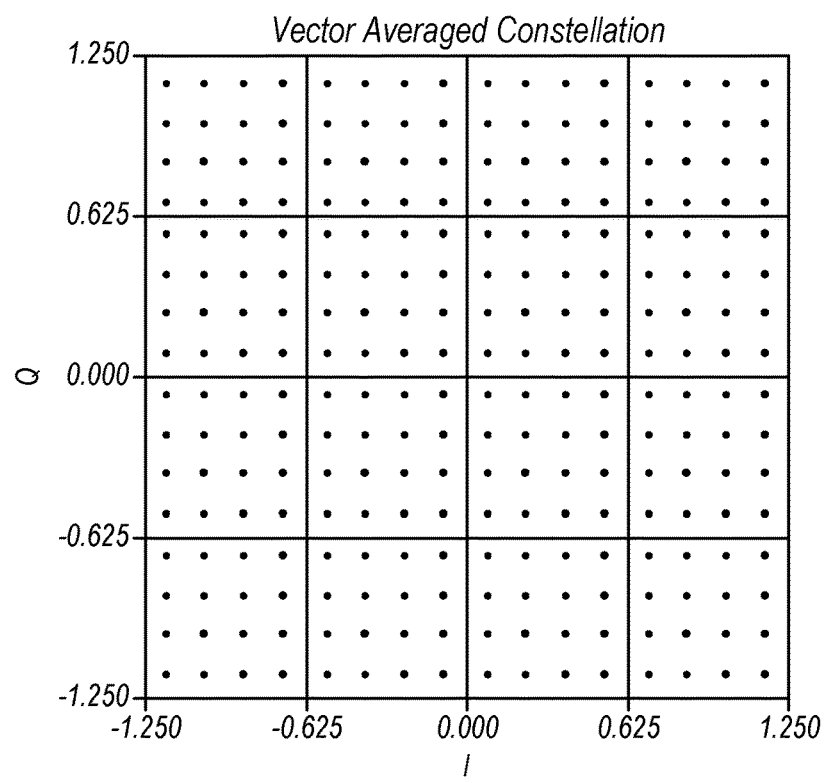
Figure 9C:
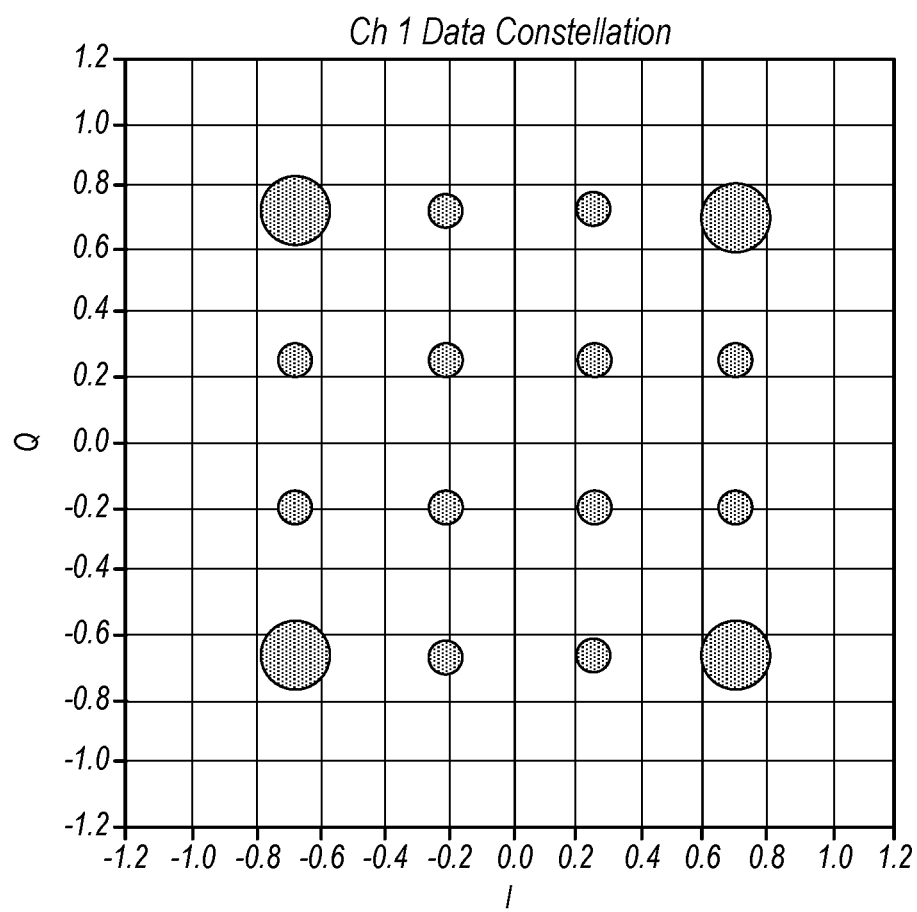
FIG. 9C is a constellation diagram of a cross-correlated constellation, according to some embodiments.

FIGS. 9A-9C—Constellation Diagrams

FIGS. 9A-9C are constellation diagrams of a raw data constellation, a vector averaged constellation, and a cross-correlated error vector magnitude measurement constellation, according to some embodiments. Constellation diagrams are sometimes useful in determining the types of impairments that are degrading the overall modulation quality.

Specifically, FIG. 9A illustrates a data constellation for a QAM signal for the raw data measured by VSA1. As illustrated, noise and distortion lead to a "fuzzy" and less precise data constellation with visible impairment. In contrast, the vector averaged constellation (i.e., that obtained from Eq. 9 for VA) illustrated in FIG. 9B shows a marked increase in clarity and accuracy of the constellation positions. As described above, the vector averaged constellation effectively removes almost all of the noise from the received signal, regardless of where it is introduced, to recover the modulated waveform with impairments caused only by linear and non-linear distortion (in other words, the errors that are common to every repetition of the received waveform).

As illustrated in FIG. 9C, a constellation diagram for a cross correlation-based error vector measurement may be utilized to represent the error vector magnitudes as circles whose centers are placed at the center of the unimpaired reference constellation and whose diameters represents the magnitude of the error vector obtained via cross correlation. FIG. 9C is a conceptual illustration of such a constellation diagram for a lower order QAM constellation.

The presently disclosed embodiments may be realized in any of various forms. For example, any of the various embodiments may be realized as a computer-implemented method, a computer-readable memory medium, or a computer system. Furthermore, any of the presently disclosed embodiments may be realized using one or more custom-designed hardware devices such as ASICs and/or using one or more programmable hardware elements such as FPGAs.

A computer-readable memory medium is a memory medium that stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computer system may be configured to include a processor (or a set of processors) and a memory medium. The memory medium stores program instructions. The processor is configured to read and execute the program instructions from the memory medium. The program instructions are executable by the processor to implement a method, e.g., any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a mobile computing device, a tablet computer, a wearable computer, etc.

In some embodiments, a set of computers distributed across a network may be configured to partition the effort of executing a computational method (e.g., any of the method embodiments disclosed herein).

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method, comprising:
   receiving a modulated waveform from a source a plurality of times, wherein the source comprises a device-under-test (DUT);
   transmitting the plurality of received modulated waveforms to each of a first vector signal analyzer (VSA) and a second VSA;
   by the first VSA, and for each of the plurality of received modulated waveforms, demodulating the received modulated waveform to obtain a first error vector;

by the second VSA, and for each of the plurality of received modulated waveforms, demodulating the received modulated waveform to obtain a second error vector;

for each of the plurality of received modulated waveforms, performing a cross-correlation calculation on the respective first error vector and the respective second error vector to obtain a cross-correlation measurement;

averaging over the cross-correlation measurements corresponding to each of the plurality of received modulated waveforms to obtain an averaged cross-correlation measurement, wherein performing said cross-correlation calculation and averaging reduces a level of noise in the averaged cross-correlation measurement that is uncorrelated between the first error vectors and the second error vectors; and determining a modulation quality measurement based at least in part on the averaged cross-correlation measurement.

2. The method of claim 1, the method further comprising:
vector averaging over the first error vectors of the plurality of received modulated waveforms to obtain a first vector averaged error vector;

vector averaging over the second error vectors of the plurality of received modulated waveforms to obtain a second vector averaged error vector; and determining a vector averaged measurement based at least in part on the first vector averaged error vector and the second vector averaged error vector, wherein the modulation quality measurement comprises a level of transmission noise of the source, and wherein determining the modulation quality measurement based at least in part on the averaged cross-correlation measurement comprises subtracting the square of the vector averaged measurement from the square of the cross-correlation measurement.

3. The method of claim 1,
wherein the modulation quality measurement comprises one of:
an error vector magnitude (EVM);
a modulation error ratio (MER); or
a ratio of correlated power to total signal power (Rho).

4. The method of claim 1, the method further comprising:
selecting a gain to be applied to the received modulated waveform, wherein the number of times the modulated waveform is received from the source is based at least in part on the selected gain.

5. The method of claim 1, the method further comprising:
determining a target level of noise reduction associated with the modulation quality measurement; and
selecting a gain to be applied to the received modulated waveform, wherein the gain is selected based at least in part on the determined target level of noise reduction.

6. The method of claim 1,
wherein performing the cross-correlation calculation on the respective first error vectors and the respective second error vectors and performing said averaging reduces phase noise and broadband noise introduced by the first VSA and the second VSA in the modulation quality measurement.

7. The method of claim 1, wherein the modulated waveform comprises a quadrature amplitude modulation (QAM) signal.

8. The method of claim 1,
wherein said performing the cross-correlation calculation and said averaging over the cross-correlation measurements is performed separately for each of a plurality of symbols of the received modulated waveforms.

9. The method of claim 1,
wherein said performing the cross-correlation calculation and said averaging over the cross-correlation measurements is performed separately for each of a plurality of subcarriers of the received modulated waveforms.

10. A measurement system for determining a modulation quality measurement, the system comprising:
a processor coupled to memory;
a splitter configured to receive a modulated waveform from a source;
a first vector signal analyzer (VSA) coupled to the splitter;
a second VSA coupled to the splitter;
wherein the system is configured to:
receive, by the splitter, the modulated waveform from the source a plurality of times, wherein the source comprises a device-under-test (DUT);
transmit, by the splitter, the plurality of received modulated waveforms to each of the first VSA and the second VSA;
by the first VSA, and for each of the plurality of received modulated waveforms, demodulate the received modulated waveform to obtain a first error vector;
by the second VSA, and for each of the plurality of received modulated waveforms, demodulate the received modulated waveform to obtain a second error vector;
by the processor:
for each of the plurality of received modulated waveforms, perform a cross-correlation calculation on the respective first error vector and the respective second error vector to obtain a cross-correlation measurement;
average over the cross-correlation measurements corresponding to each of the plurality of received modulated waveforms to obtain an averaged cross-correlation measurement, wherein performing said cross-correlation calculation and averaging reduces a level of noise in the averaged cross-correlation measurement that is uncorrelated between the first error vectors and the second error vectors;
determine the modulation quality measurement based at least in part on the averaged cross-correlation measurement; and
store the modulation quality measurement in the memory.

11. The measurement system of claim 10, wherein the processor is further configured to:
vector average over the first error vectors of the plurality of received modulated waveforms to obtain a first vector averaged error vector;
vector average over the second error vectors of the plurality of received modulated waveforms to obtain a second vector averaged error vector; and
determine a vector averaged measurement based at least in part on the first vector averaged error vector and the second vector averaged error vector, and
wherein the modulation quality measurement comprises a level of transmission noise of the source, and wherein determining the modulation quality measurement based at least in part on the averaged cross-correlation measurement comprises subtracting the square of the vector averaged measurement from the square of the cross-correlation measurement.

12. The measurement system of claim 10, wherein the modulation quality measurement is determined separately for each of a plurality of symbols of the modulated waveform.

13. The measurement system of claim 10, wherein the system is further configured to:
select a gain to be applied to the received modulated waveform, wherein the number of times the modulated waveform is received from the source is based at least in part on the selected gain.

14. The measurement system of claim 10, wherein the processor is further configured to:
determine a target level of noise reduction associated with the modulation quality measurement; and
select a gain to be applied to the received modulated waveform, wherein the gain is selected based at least in part on the determined target level of noise reduction.

15. The measurement system of claim 10, wherein the modulation quality measurement comprises one of:
an error vector magnitude (EVM);
a modulation error ratio (MER); or
a ratio of correlated power to total signal power (Rho).

16. A non-transitory computer-readable memory medium comprising program instructions which, when executed by a computer, are configured to cause a measurement system to determine a modulation quality measurement of a device under test (DUT), wherein the measurement system comprises the computer and a first and second vector signal analyzer (VSA), and wherein the program instructions are executable by the computer to cause the measurement system to:
receive a modulated waveform from the DUT a plurality of times;
transmit the plurality of received modulated waveforms to each of the first VSA and the second VSA;
by the first VSA, and for each of the plurality of received modulated waveforms, demodulate the received modulated waveform to obtain a first error vector;
by the second VSA, and for each of the plurality of received modulated waveforms, demodulate the received modulated waveform to obtain a second error vector;
by the computer:
for each of the plurality of received modulated waveforms, perform a cross-correlation calculation on the respective first error vector and the respective second error vector to obtain a cross-correlation measurement;
average over the cross-correlation measurements corresponding to each of the plurality of received modulated waveforms to obtain an averaged cross-correlation measurement, wherein performing said cross-correlation calculation and averaging reduces a level of noise in the averaged cross-correlation measurement that is uncorrelated between the first error vectors and the second error vectors;
determine the modulation quality measurement based at least in part on the averaged cross-correlation measurement, wherein the modulation quality measurement comprises a level of transmission noise of the DUT; and
store the modulation quality measurement in a memory.

17. The non-transitory computer-readable memory medium of claim 16, wherein the program instructions are further executable by the computer to cause the measurement system to:
determine a vector averaged measurement based on the first error measurements and the second error measurements, wherein the vector averaged measurement describes the symbol vector error with random or incoherent noise reduced or removed,
wherein determining the modulation quality measurement based at least in part on the averaged cross-correlation measurement comprises comparing the averaged cross-correlation measurement to the vector averaged measurement.

18. The non-transitory computer-readable memory medium of claim 17, wherein, to determine the vector averaged measurement, the program instructions are further executable by the computer to cause the measurement system to:
perform a vector average over the first error vectors of the plurality of received modulated waveforms to obtain a first vector averaged error vector;
perform the vector average over the second error vectors of the plurality of received modulated waveforms to obtain a second vector averaged error vector; and
determine a vector averaged measurement based at least in part on the first vector averaged error vector and the second vector averaged error vector.

19. The non-transitory computer-readable memory medium of claim 16, wherein the program instructions are further executable by the computer to cause the measurement system to:
determine a target level of noise reduction associated with the modulation quality measurement; and
select a gain to be applied to the received modulated waveform, wherein the gain is selected based at least in part on the determined target level of noise reduction.

20. The non-transitory computer-readable memory medium of claim 16, wherein the modulation quality measurement is determined separately for each of a plurality of symbols and each of a plurality of subcarriers of the modulated waveform.

* * * * *